United States Patent [19]

Kyomasu

[11] Patent Number: 5,598,022
[45] Date of Patent: *Jan. 28, 1997

[54] OPTICAL SEMICONDUCTOR DEVICE

[75] Inventor: Mikio Kyomasu, Hamamatsu, Japan

[73] Assignee: Hamamatsu Photonics K.K., Hamamatsu, Japan

[ * ] Notice: The term of this patent shall not extend beyond the expiration date of Pat. No. 5,410,175.

[21] Appl. No.: 306,933

[22] Filed: Sep. 16, 1994

Related U.S. Application Data

[63] Continuation-in-part of Ser. No. 899,591, Jun. 18, 1992, Pat. No. 5,410,175, which is a continuation of Ser. No. 576,065, Aug. 31, 1990, abandoned.

[30] Foreign Application Priority Data

Sep. 17, 1993 [JP] Japan .................................. 5-231561

[51] Int. Cl.$^6$ .................................................. H01L 27/14
[52] U.S. Cl. .......................... 257/458; 257/446; 257/514; 257/517; 257/519
[58] Field of Search .................................. 257/458, 446, 257/514, 517, 459, 448, 461, 462, 519, 548

[56] References Cited

U.S. PATENT DOCUMENTS

| 4,831,430 | 5/1989 | Umeji ......................................... 257/458 |
| 5,410,175 | 4/1995 | Kyomasu et al. ....................... 257/458 |

FOREIGN PATENT DOCUMENTS

| 3-91959 | 4/1991 | Japan ....................................... 257/458 |
| 3145771 | 6/1991 | Japan ....................................... 257/458 |

OTHER PUBLICATIONS

Kyomasu et al, "Development of Integrated Silicon PIN Photodiode and Its Optical and Electrical Characteristics", Partial English Translation of Electronics, Information and Communication Society Paper C–11, vol. J74–C–11 No. 5, pp. 477–487, May 1991.

Kyomasu, "The Integrated Master Slice Type Transimpedance Amplifier Photosensors Using PIN–Bipolar Process", English Abstract, pp. 1–29, figures 1–15 no date.

Kyomasu et al, "Integrated high Speed Silicon Pin Photodiode Sensor", IEEE 1991, pp. 289–292 no month.

*Primary Examiner*—Donald L. Monin, Jr.
*Attorney, Agent, or Firm*—Cushman Darby & Cushman IP Group of Pilsbury Madison & Sutro LLP

[57] ABSTRACT

The plurality of functioning circuits are formed in a plurality of P-type well regions formed on a remaining part of said low concentration N-type layer, by isolating from each other. According to the present invention, the photoelectric current from the PIN photodiode can be processed in the functioning circuits formed in the P-type well regions by isolating from each other, so that the interference between the functioning circuits can be prevented and also the shift of the current flowing in each functioning circuit due to the impossibility of the high concentration N-type semiconductor layer to be grounded can be prevented. Therefore, the malfunction of the integrated PIN photodiode sensor can be prevented, and the PIN photodiode sensor can operate with high speed because the distributed resistance between the functioning circuits is decreased.

24 Claims, 10 Drawing Sheets

OPTICAL SEMICONDUCTOR DEVICE

This application is a continuation in part of U.S. application Ser. No. 07/899,591, now U.S. Pat. No. 5,410,175, filed Jun. 18, 1992, which was a continuation of U.S. application Ser. No. 07/576,065, filed Aug. 31, 1990, now abandoned.

BACKGROUND OF THE INVENTION

1. Field of the Invention

The present invention relates to an optical semiconductor device processing a signal from a photodiode. More precisely, the present invention relates to a PIN photodiode sensor capable of preventing malfunction.

2. Related Background Art

Optoelectronic integrated circuits in which a photodetector and a circuit coupled to the photodetector are integrated on the same semiconductor substrate have recently drawn attention. A PIN photodiode sensor using a PIN photodiode as a photodetector in such an optoelectronic integrated circuit is well known.

SUMMARY OF THE INVENTION

It is an object of the present invention to provide a PIN photodiode sensor which is capable of preventing malfunction and interference between functioning circuits.

The present invention is for an optical semiconductor device or a PIN photodiode sensor. A PIN photodiode sensor of the present invention includes a low concentration N-type layer formed on a high concentration N-type semiconductor substrate to be an anode, and a high concentration P-type semiconductor layer to be a cathode formed on a part of the low concentration N-type layer, and a plurality of functioning circuits for processing a photoelectric current generated by irradiating the PIN photodiode with light, formed in a P-type well in the low concentration N-type layer. The plurality of functioning circuits are formed in a plurality of P-type well regions formed on a remaining part of the low concentration N-type layer, by being isolated from each other.

According to the structure of the PIN photodiode sensor, the PIN photodiode comprising the high concentration N-type semiconductor substrate, the low concentration N-type layer, and the P-type high concentration semiconductor layer is reverse biased, and the photoelectric current generated upon the light incident on the reverse biased PIN photodiode sensor can be processed in the plurality of functioning circuits formed in the plurality of P-type well regions.

According to the present invention, the photoelectric current from the PIN photodiode comprising the high concentration N-type semiconductor substrate, the low concentration N-type layer and P-type high concentration semiconductor layer can be processed in the functioning circuits formed in the P-type well regions (layers) by being isolated from each other.

The isolation of the functioning circuits has many advantages in the functioning circuits operation. When the P-type well regions are not isolated, parasitic diodes or transistors having the P-type well region and N-type substrate are connected each other and a potential of a ground-line of the P-type well region is varied.

This variation mechanism and malfunction of the functioning circuits caused by the variation will now be more precisely explained. Each of the functioning circuits is electrically connected to a ground pad and to the P-type well region having distributed resistance, through a ground-metal-line. In the case that the functioning circuits are formed in the non-isolated P-type well region, since each functioning circuit is electrically connected to the non-isolated P-type well region and to a wiring, a source current generated by an operation of the parasitic transistor and of a divider formed in the P-type well region causes a modulation of the potential or impedance of a ground-line, which is due to a impedance of the wiring or metal line (metallization). The modulation affects another functioning circuits through the wiring or metal line, which causes a modulation of the another circuits, and causes malfunction of the functioning circuit.

The optical semiconductor device (PIN photodiode sensor) according to present invention can suppress the malfunction, because the optical semiconductor device has the isolated P-type well layers or regions. Since each functioning circuit is formed in a respective isolated P-type well region, there exits only the ground-metal-line between the ground-line of each functioning circuit and ground pad, and there is no passage between the distributed resistance of the P-type well regions. Therefore, the modulation caused by the source current of the functioning circuit or by the parasitic current of the parasitic transistor or diode, is decreased, which increases strength against malfunction.

Further, since a bias is applied to the PIN photodiode independent from the functioning circuit, a drift speed of the photodiode is increased, and since the distributed resistance is decreased, the RC constant based on the distributed resistance is decreased. Therefore, the PIN photodiode sensor can operate with high speed. Such a PIN photodiode sensor can be applied in the fields such as optical communications, optical switches and others using optical fibers.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

FIG. 2 is grounded through an electrode 400a, and a cathode electrode 495 of the PIN photodiode PD10 is connected to the base electrode 491 of the transistor TR10 shown in FIG. 1. The parasitic diode Di consists of the p-type semiconductor layer 400, 410, 420, 430 and the n-type semiconductor layer 450a, 450b, and an anode 400 of the parasitic diode Di is grounded through the electrode 400a.

FIG. 5 is connected to the base electrode 510 of the transistor TR30, and a cathode 300a of the PIN photodiode PD20 is connected to a voltage supply and to a cathode of the parasitic diode Di shown in FIG. 5. The parasitic diode Di comprises the p-type semiconductor layer 330 and the n-type semiconductor layers 540, 550, and an anode 330 of the parasitic diode Di is grounded through an electrode 599. A collector of the transistor TR30 is grounded through a collector electrode 520.

DETAILED DESCRIPTION OF THE PREFERRED EMBODIMENTS

Figure 1:
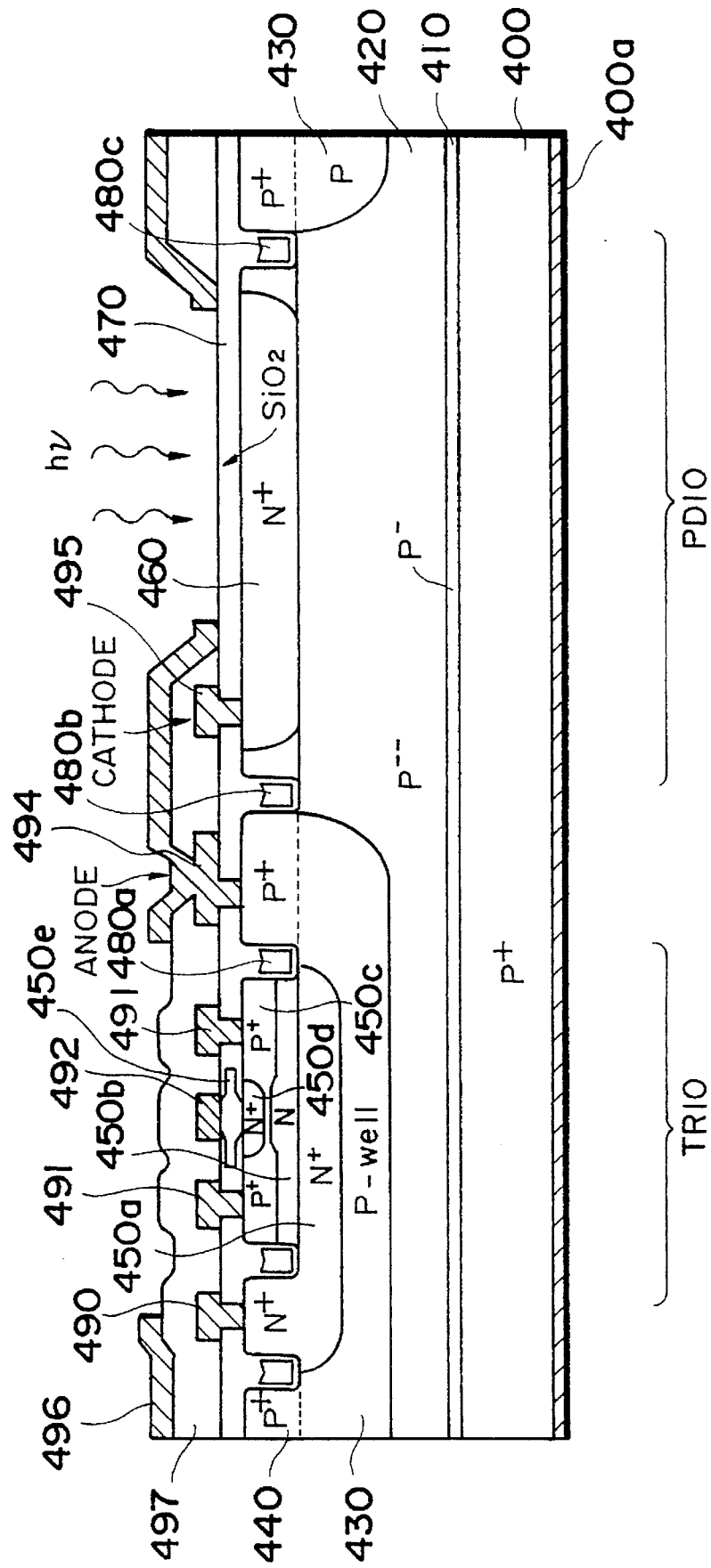
FIG. 1 is a cross sectional view showing a part of a PIN photodiode sensor using a P-type semiconductor substrate 400.

One embodiment of a PIN photodiode sensor according to the present invention will now be described with reference to the drawings hereinbelow. The same components are represented by the same reference numerals, and the repetitive description on the same components are omitted. Before explaining the embodiment of the present invention, some optical semiconductor devices will be described using FIG. 1 through FIG. 5. After these optical devices are explained, the embodiment of the invention is described using FIG. 6 through FIG. 10.

FIG. 1 is a sectional view of a PIN photodiode PD10 and an NPN transistor TR10 which are formed on a P-type silicon substrate 400.

The PIN photodiode PD10 comprises a $P^+$ semiconductor substrate 400, a $P^-$ semiconductor layer 410, a $P^{--}$ semiconductor layer 420, an $N^+$ semiconductor layer 460, an electrode 400a, and an electrode 495.

The NPN transistor TR10 comprises a $P^+$ semiconductor substrate 400, a $P^-$ semiconductor layer 410, a $P^{--}$ semiconductor layer 420, a P-well 430, an $N^+$ semiconductor layer 450a formed in the P-well 430, an N-type semiconductor layer (collector) 450b, a $P^+$ semiconductor layer 450c (base), an $N^+$ semiconductor layer (emitter) 450d, a polysilicon electrode 450e, an electrode 400a, and electrodes 490–492, as shown in the figure. The surfaces of the transistor TR10 and the photodiode PD10 are covered with an silicon dioxide film 470 for protection. The reference numeral 497 denotes passivation and 496 denotes Al metallization.

In the PIN photodiode sensor having the PIN photodiode PD10 and the functioning circuit (a circuit comprising the transistor TR10) for processing a photoelectric current from the PIN photodiode PD10 on the same substrate 400, an operation of the circuit depends on parasitic devices. For example, in an operation of the PIN photodiode sensor having the structure shown in FIG. 1, a bias voltage of the photodiode PD10 is limited by a parasitic device (parasitic diode or transistor) Di, and a current generated by an operation of a parasitic PNP bipolar transistor (diode) Di of the NPN transistor TR10 causes a modulation of the anode voltage of the photodiode PD10. Consequently, the modulation feeds back to the transistor TR10 through a parasitic capacitance of the photodiode PD10, and/or oscillation or malfunction occurs due to the modulation of ground-metal-line caused by current of another transistor.

In order to prevent the malfunction of the functioning circuit, a $P^+$ tab electrode is formed on a low-concentration $P^{--}$ layer 420 so that the operating current of the parasitic diode Di forming the parasitic PNP bipolar transistor is eliminated there through. Accordingly, using the $P^+$ tab electrode, current of the parasitic diode (transistor) Di can be led directly to the ground pad, the bonding wire and the frame, which prevent the malfunction of the functioning circuit.

Figure 2:
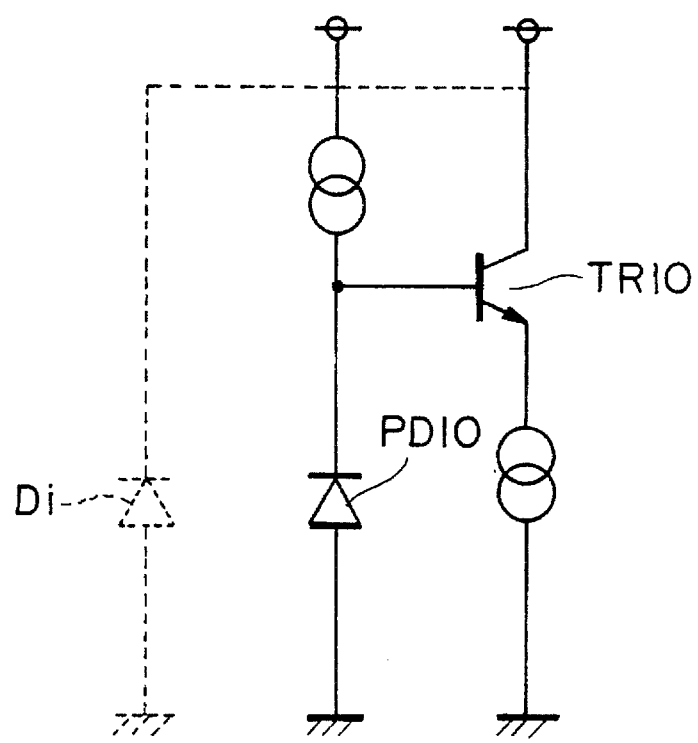
FIG. 2 is an equivalent circuit of a sensor shown in FIG. 1 comprising a PIN photodiode PD10, an NPN transistor TR10, a parasitic diode Di of the transistor TR10. An anode 400 of the PIN photodiode PD10 shown in FIG. 1

As shown in FIG. 2, the anode voltage of the photodiode PD10 is determined by the current source, and the maximum of the collector-emitter voltage is a voltage between the power supply and ground. Accordingly, the bias voltage of the photodiode PD10 never exceeds a voltage of the power supply.

Figure 3:
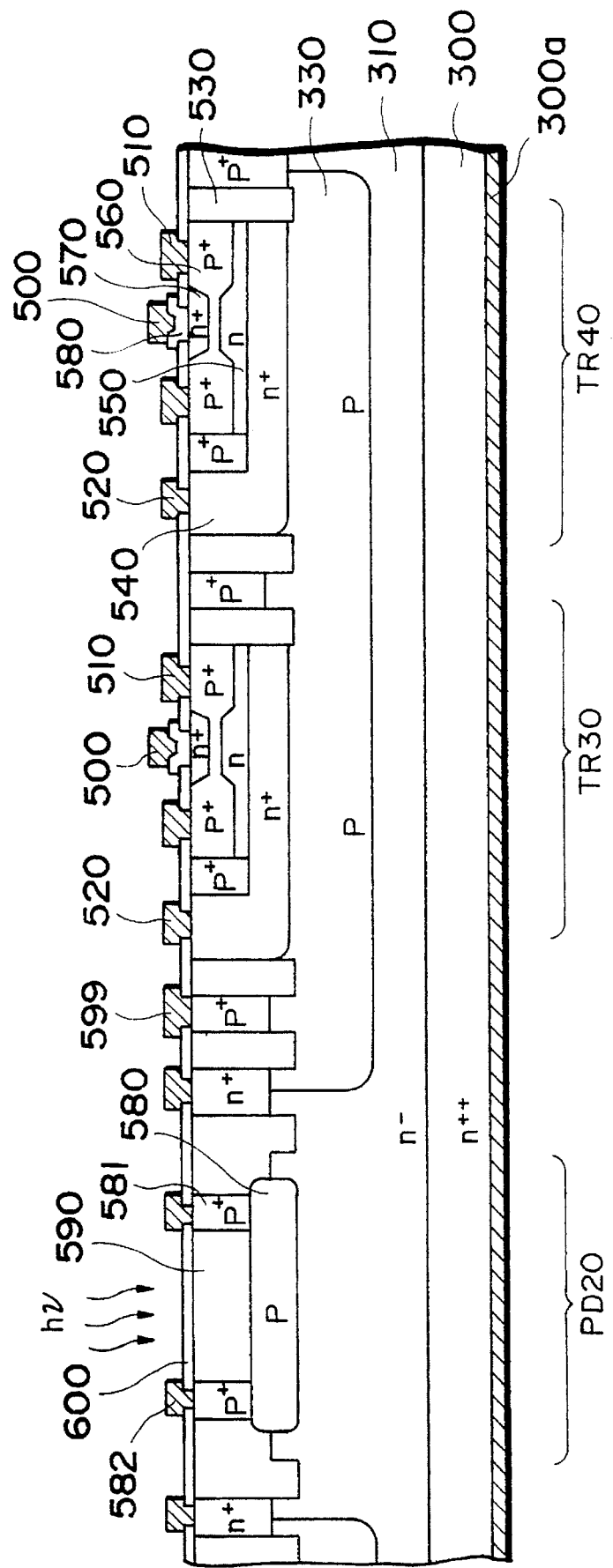
FIG. 3 is a cross sectional view of a part of a PIN photodiode sensor using an N-type semiconductor substrate 300, and an NPN transistor TR30 and an NPN transistor TR40 are both formed in a P-well 330.
Figure 4:
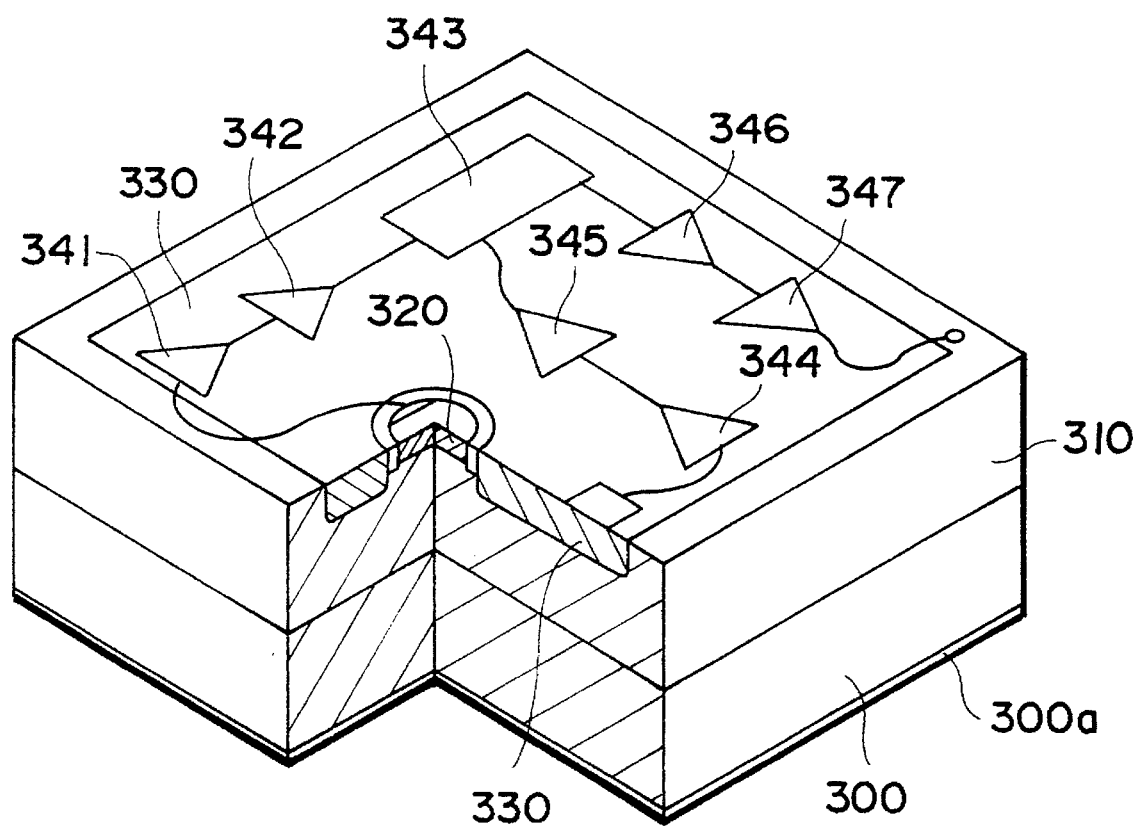
FIG. 4 is a perspective view showing the PIN photodiode sensor structure shown in FIG. 3 and a cross section thereof in part. A plurality of functioning circuits 341–347 are all formed in a P-well 330. The functioning circuit 341 is an operational amplifier comprising a transistor TR30 of FIG. 3, and the functioning circuit 342 is an operational amplifier comprising a transistor TR40 of FIG. 3.
Figure 5:
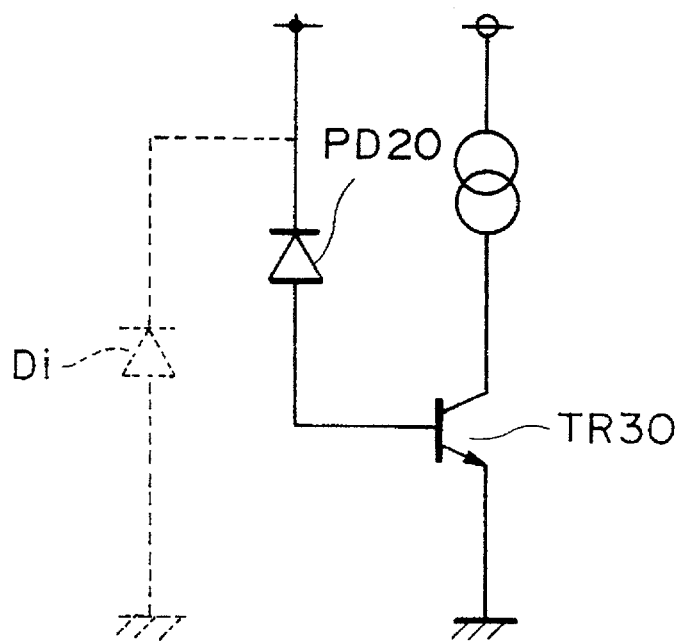
FIG. 5 is an equivalent circuit of a sensor shown in FIG. 3 comprising a PIN photodiode PD20, an NPN transistor TR30, a parasitic diode Di of the transistor TR30. An anode 582 of the PIN photodiode PD20 shown in FIG. 4

On the other hand, in order to avoid the anode to be grounded, an N-type semiconductor substrate can be used in the photodiode sensor instead of the P-type semiconductor substrate 400 shown in FIG. 1. Referring to FIG. 3–FIG. 5, a photodiode sensor using an N-type semiconductor substrate will be explained.

FIG. 3 is a cross section of a part of this photodiode sensor. An NPN transistor TR30 and an NPN transistor TR40 are both formed in a P-well 330. A photodiode PD20 comprises an $N^{++}$ semiconductor substrate 300, an $N^-$ semiconductor layer 310, P-type semiconductor layers 580 and 590, a $P^+$ semiconductor layer 581, an electrode 300a and an electrode 582, as shown in the figure.

The NPN transistor TR40 comprises an $N^{++}$ semiconductor substrate 300, an $N^-$ semiconductor layer 310, a P-well 330, an $N^+$ semiconductor layer 540 formed in the P-well 330, an N-type semiconductor layer (collector) 550, a $P^+$ semiconductor layer 560 (base), an $N^+$ semiconductor layer (emitter) 570, a polysilicon electrode 580, an electrode 300a and electrodes 500, 510 and 520. The structure of the transistor TR30 is the same as that of the transistor TR40. The surfaces of the transistor TR30, the transistor TR40 and the photodiode PD20 are covered with an silicon dioxide film 600 for protection. Note that the passivation and the metal line are not shown in FIG. 3.

FIG. 4 is a perspective view showing the structure of the PIN photodiode sensor shown in FIG. 3 and a cross section thereof in part. A plurality of functioning circuits 341–347 are all formed in the P-well 330.

A high-resistant epitaxial layer 310 having a low concentration ($N^-$) and a P-type semiconductor layer 320 are deposited on an N-type semiconductor substrate 300 in order thereby to form a PIN photodiode, and a P-well region 330 is formed in the high resistant epitaxial layer 310, and the functioning circuits 341–347 for processing the photoelectric current from the PIN photodiode are formed in the P-well region 330, whereby the photodiode sensor is formed. The functioning circuit 341 is an operational amplifier including the transistor TR30 of FIG. 3, and the functioning circuit 342 is an operational amplifier including the transistor TR40 of FIG. 3. Note that the other functioning circuits 343–347 also comprise the NPN bipolar transistors (not shown).

FIG. 5 is an equivalent circuit of the sensor shown in FIG. 3 comprising the PIN photodiode PD20, the NPN transistor TR30 and the parasitic diode Di of the transistor TR30. The semiconductor substrate 300 is N-type, so that a P-well buried layer 330 underneath the NPN transistor TR30 becomes ground through the electrode 599, and the substrate 300 is connected to the power supply. Therefore, the PIN photodiode PD20 is reverse biased, which means that the bias voltage applied to the PIN photodiode PD20 is independent from the power source and can be a high voltage.

However, in the case that the functioning circuits 341–347 are formed in the P-well region 330 on the N-type semiconductor substrate 300, especially that the NPN bipolar transistor TR30 is saturated, the functioning circuits 341–347 are connected each other through the parasitic PNP bipolar transistor (parasitic diode Di) and the distributed resistance of the P-well region 330.

Each collector electrode 520 of the transistors TR30, TR40 is connected to the P-type well electrode 599, and the collector electrode 520 is grounded through a ground-line. In the case of FIG. 3, when the parasitic PNP transistor Di operates or current of the divider is modulated, this current flows into distributed resistance in the well region 330 and may unexpectedly flow into the ground-metal-line through the $P^+$-tab electrode 599 because each circuit presents in the same well. In the case of the conventional PIN photodiode sensor using P-type substrate, most of the current flows to the substrate but in the case of the structure shown in FIG. 3, since the current flows the above-described way, the modulation is generated due to impedance of ground-metal-line.

Accordingly, the impedance of the ground-line connected to the P-type well layer 330 and transistor TR30 is modulated by a current of the parasitic PNP transistor, when it operates, which causes malfunction of the functioning circuits 341–347 including the transistors TR30 and TR40. In other words, the ground-line not shown in FIG. 3 is a conductor having resistance such as frame, wiring lead and others, and is connected to the $P^+$ tab electrode 599, and the current flowing through the functioning circuits 341–347 is varied by the resistance of the frame, wiring lead and others and the resistance of the output of the functioning circuits 341–347.

If the N-type semiconductor substrate 300 were dropped to the ground level this variation could be prevented, but because the N-type semiconductor substrate 300 was isolated from the P-well region 330 by the high resistant epitaxial layer 310 (which is a necessary element of the PIN photodiode) having a low concentration $N^-$, the P-well region 330 could not be grounded from the N-type semiconductor substrate 300.

Therefore, the ground of the substrate 300 or P-type well layer 330 could hardly prevent the malfunction resulting from the modulation of the functioning circuits 341–347.

Figure 6:
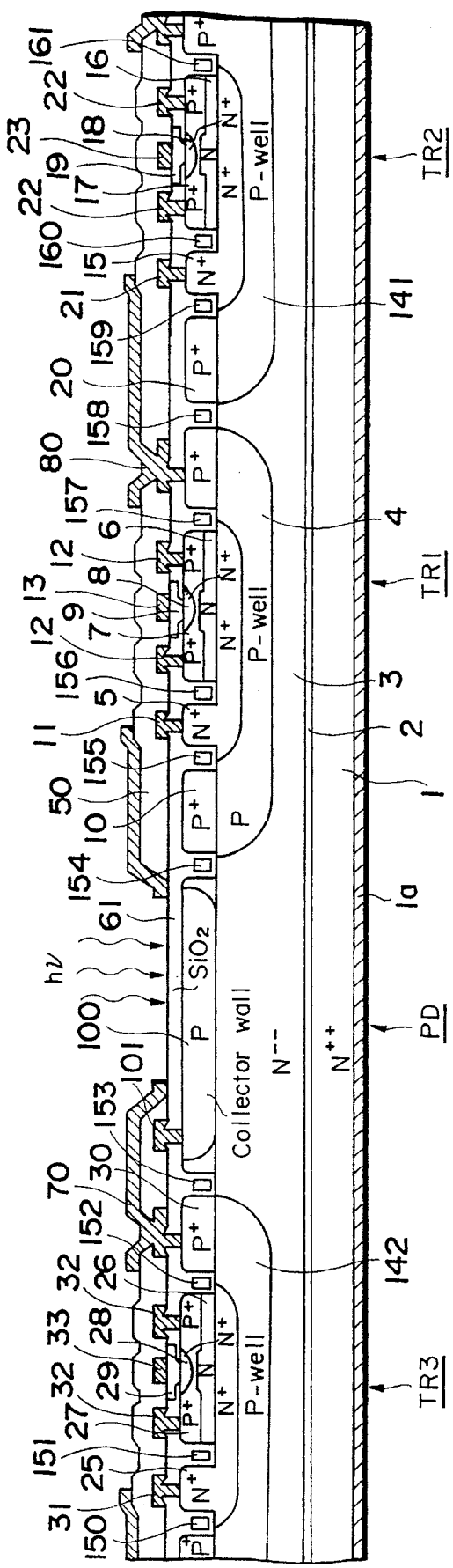
FIG. 6 is a cross sectional view showing a part of a PIN photodiode sensor according to one embodiment of the present invention. A positive potential or voltage is applied to the N-type substrate 1 through an electrode 1a, and a P-type layer 100 is grounded through an electrode 101. A P-type well layer 4 is also grounded through a tab electrode 10 and wiring (metallization) 80 connected to the tab electrode 10.

FIG. 6 shows a cross section of a main part of a PIN photodiode sensor according to one embodiment of the present invention. The PIN photodiode sensor comprises one PIN photodiode PD and functioning circuits (e.g., NPN bipolar transistors TR1, TR2) for amplifying the photoelectric current generated by the PIN photodiode PD. First, in a case that NPN bipolar transistors TR1 and TR2 are used as such functioning circuits, the structure to prevent interference between the NPN bipolar transistors TR1 and TR2 will be explained.

First of all, on the left hand side of the center of FIG. 6, an $N^-$ epitaxial layer (buffer layer) 2, an $N^{--}$ high resistant epitaxial layer (photon absorbing layer) 3, and a P-type semiconductor layer 100 to be a cathode are deposited on a low resistant ($N^{++}$) N-type semiconductor substrate 1 to be an anode in order, thereby to form a PIN photodiode PD. Reference numeral 1a is an electrode. Note that the concentration of the layer 3 is lower than that of the layer 2, and the concentration of the layer 2 is lower than that of layer 1, and the concentration of the layer 100 is higher than that of layer 3.

On the right hand side of the PIN photodiode PD, a first P-type semiconductor well layer 4 is formed on the $N^{--}$ high resistant epitaxial layer 3 which is a common layer to the PIN photodiode PD. A first NPN transistor TR1 which is isolated from the $N^{--}$ high resistant epitaxial layer 3 is formed in the first well layer 4.

The first NPN transistor TR1 formed in the first well layer 4 comprises a low resistant ($N^+$) N-type buried layer 5 which is buried in the first well layer 4, and an N-type semiconductor collector layer 6, a low resistant ($P^+$) P-type semiconductor base layer 7 and a low resistant ($N^+$) N-type semiconductor emitter layer 8 deposited on the N-type buried layer 5 in order. Then, a polysilicon electrode 9 is deposited on the emitter layer 8. Electrodes 13, 12 and 11 are formed on the polysilicon electrode 9, the base layer 7 and the N-type buried layer 5, respectively.

In the same manner, on the right hand side and left hand side of FIG. 6, a second NPN transistor TR2 and a third NPN transistor TR3 which have the same structure as that of the first NPN transistor TR1 are formed in a second P-type semiconductor well layer 141 and a third well layer 142 on the $N^{--}$ high resistant epitaxial layer 3, respectively. Note that the emitter, base and collector of the second NPN transistor TR2 and the third NPN transistor TR3 are emitter layers 18 and 28, base layers 17 and 27, and collector layers 16 and 26, respectively.

Figure 7:
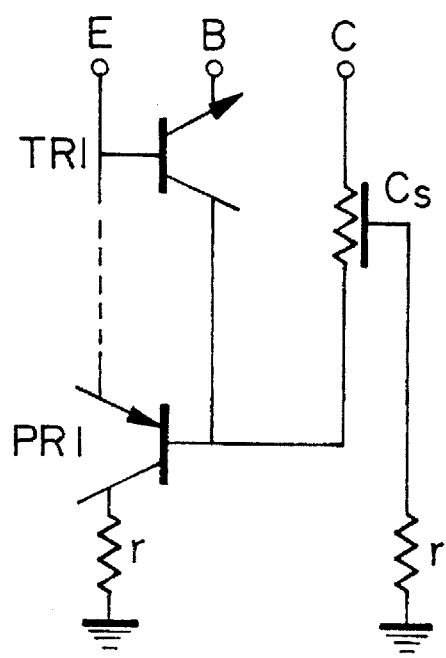
FIG. 7 is an equivalent circuit of a parasitic transistor PR1 of a transistor TR1 and a parasitic capacitance Cs shown in FIG. 6. A collector 4 of the parasitic transistor PR1 is grounded through an electrode 80, a base 5 of the parasitic transistor TR1 is a collector 5 of the transistor TR1, and an emitter 7 of the parasitic transistor PR1 is a base 7 of the transistor TR1. The parasitic capacitance Cs is based on the capacitance between the P-type well layer 4 and N-type layer 5.

The first well layer 4, the second well layer 141, and the third well layer 142 are electrically connected to the P$^+$ tab electrodes 70 and 80 through the low resistant (P$^+$) semiconductor layers 10, 20 and 30 formed on the first well layer 4, the second well layer 141 and the third well layer 142, respectively. Note that the emitter layers 8, 18 and 28, the base layers 7, 17 and 27, and the collector layers 6, 16 and 26 of the first, second and third transistors TR1, TR2 and TR3 are isolated by the isolation regions (insulators) 150–161, respectively. An equivalent circuit including a parasitic device of the first NPN transistor TR1 is shown in FIG. 7.

As described above, when the PIN photodiode PD and the functioning circuits (e.g., the first, second and third NPN transistors TR1, TR2 and TR3) for sensing the photoelectric current from the PIN photodiode PD are all formed on the substrate (the N-type semiconductor substrate 1), since the distributed resistance due to the first, second and third well layers 4, 141 and 142 is not presented between the functioning circuits, the interference between the functioning circuits can be prevented. Further, the current flowing into the first, second and third parasitic PNP transistors PR1, PR2 and PR3 can be eliminated through the P$^+$ tab electrodes 70 and 80. In this case, because the functioning circuits are isolated from each other, the current flowing into the ground hardly affects the functioning circuits even if the current is fed back to each functioning circuit by the resistance of the frame and lead wires.

Thus, where a functioning circuit is a single NPN transistor, each functioning circuit is formed in a different well layer (although all functioning circuits are not necessary to be formed in different well layers), which prevents the malfunction of the PIN photodiode sensor. It should be noted that in the present invention, an NPN bipolar transistor is used as a functioning circuit but a MOSFET or a MESFET can be used, and that compound semiconductors such as GaAs other than Si can be used as the material of the N-type semiconductor substrate 1.

Figure 8:
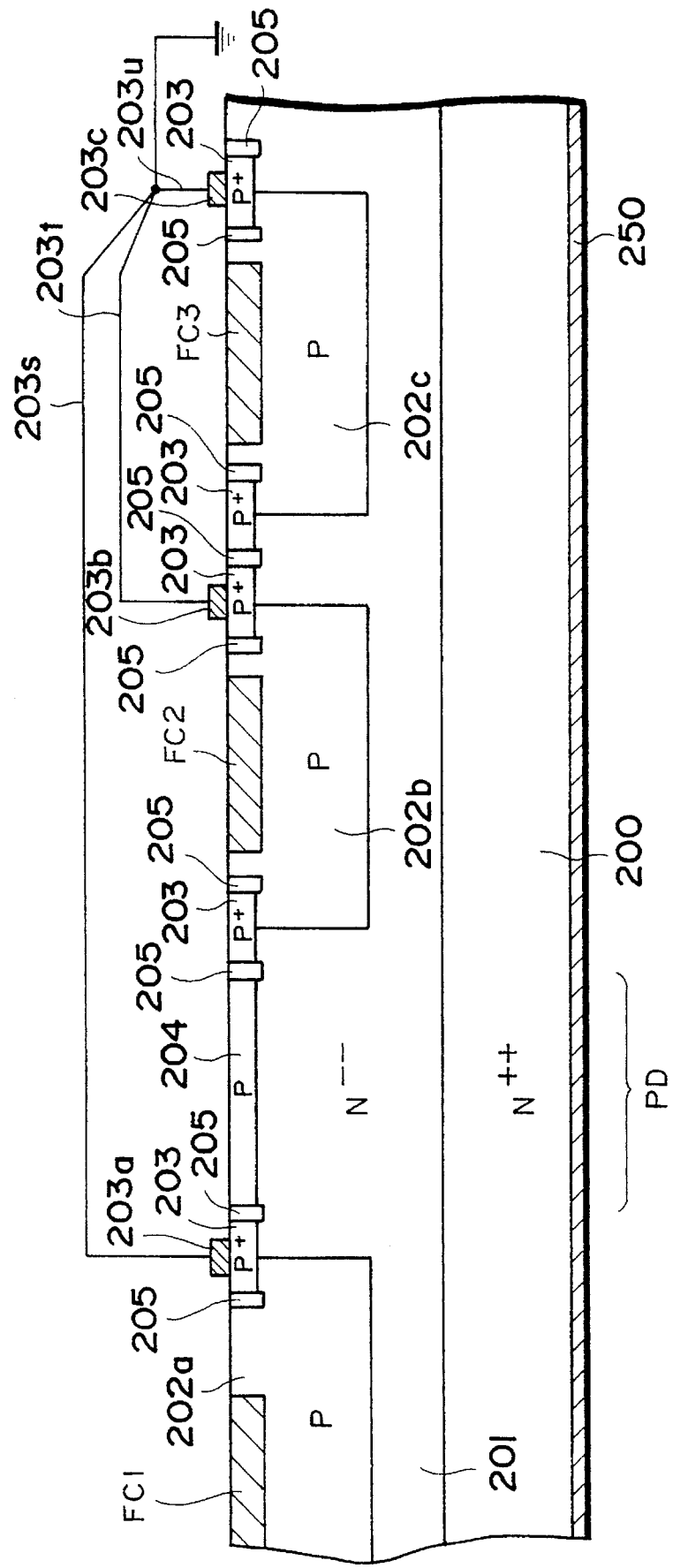
FIG. 8 is a cross sectional view showing a part of a PIN photodiode sensor according to one embodiment of the present invention.

Further, each functioning circuit does not have to be a single NPN transistor. In a case that a group of the active devices such as transistors, or a group of the active devices and the passive devices, such as a current-voltage converting amplifier or a peak holding circuit is a functioning circuit, the functioning circuits are formed in a respect well layer isolated from each other, which also prevents the malfunction of the PIN photodiode sensor in the same way as above. For example, as shown in FIG. 8, an N$^-$ high resistant epitaxial layer 201 is formed on an N$^{++}$ N-type semiconductor substrate 200, and a P-type semiconductor layer 204 is formed on a part of the epitaxial layer 201, thereby to form a PIN photodiode PD on the left side of the center of FIG. 8. A plurality of P-type well layers 202a–202c are formed on a remaining portion of the high resistant epitaxial layer 201 to be isolated from each other, and functioning circuits FC1–FC3 (e.g., a current-voltage converting amplifier or a peak holding circuit (not shown)) are formed in the respective well layers 202a–202c isolated from each other. Further, a P$^+$ layer 203 is formed on each well layer 202a–202c, and the well layers 202a–202c are grounded through the electrodes and interconnections 203a, 203b, 203c, 203s, 203t, 203u having resistances. The electrodes 203a, 203b, 203c are P$^+$ tab electrodes formed on the P$^+$ layer 203, and the interconnections 203s, 203t, 203u are conductors such as a metallization, frame, lead wires or other such devices, and 250 is an electrode. Each of the P$^+$ layer 203, the well layers 202a–202c and the P-type semiconductor layer 204 is electrically isolated by an isolation region (insulator) 205. Such functioning circuits FC1–FC3 are formed in the well-layers 202a–202c to be isolated from each other, respectively, so that the influence of distributed resistances of the conductors such as interconnections 203s, 203t and 203u and the well layers 202a–202c presented between each of the functioning circuits FC1, FC2 and FC3 can be decreased.

In other words, in the case that the functioning circuits are all formed in one well layer as shown in FIG. 3 or FIG. 4, the functioning circuits FC1, FC2 and FC3 shown in FIG. 8 are connected each other through the ground by the interconnections 203s, 203t and 203u and the one well layer having distributed resistance, these elements having resistance forms a voltage-divider bias circuit, and which makes the current feed back to the functioning circuits FC1, FC2 and FC3.

However, in the photodiode sensor of the present invention, the functioning circuits FC1, FC2 and FC3 are formed in the well layers 202a, 202b and 202c, respectively, so that these functioning circuits FC1, FC2 and FC3 are isolated from each other. Consequently, the influence of the interconnections 203s, 203t and 203u can be decreased.

Therefore, the interference between each of the functioning circuits FC1, FC2 and FC3 can be decreased and malfunction of the integrated PIN photodiode sensor can be prevented. Note that all of the functioning circuits FC1, FC2 and FC3 are not necessary to be formed in the isolated well layers 202a, 202b and 202c. Further, if a different frame which is connected between the functioning circuits is used, the interference between each of the functioning circuits FC1, FC2 and FC3 can be decreased to some extent.

Figure 9:
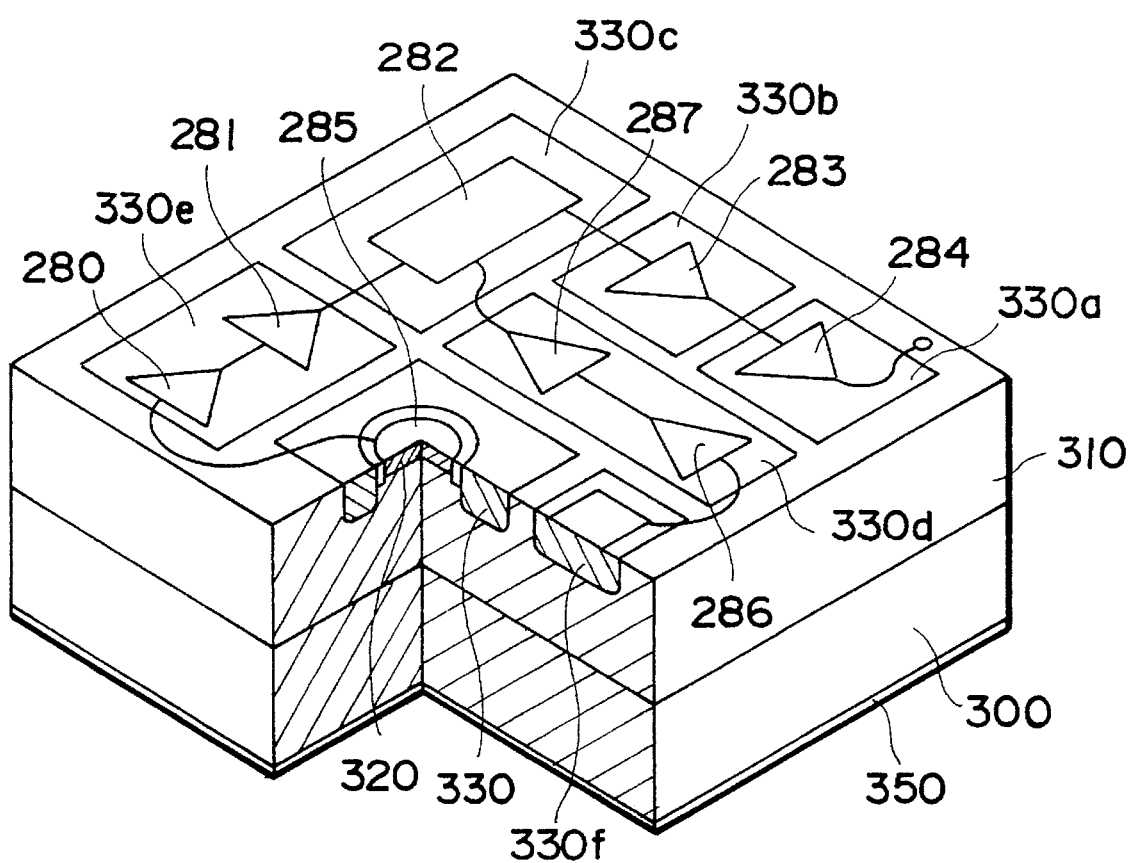
FIG. 9 is a perspective, partial cross-sectional view showing the structure of a PIN photodiode. A plurality of functioning circuits 280–284, 286, 287 are formed in different P-wells 330a–330e. The functioning circuit 284 is an operational amplifier 284 comprising a transistor TR1 of FIG. 6, and the functioning circuit 283 is an operational amplifier 283 comprising a transistor TR2 of FIG. 6. The operational amplifier 284 is formed in the P-well 330a, and the operational amplifier 283 is formed in the P-well 330b.
Figure 10:
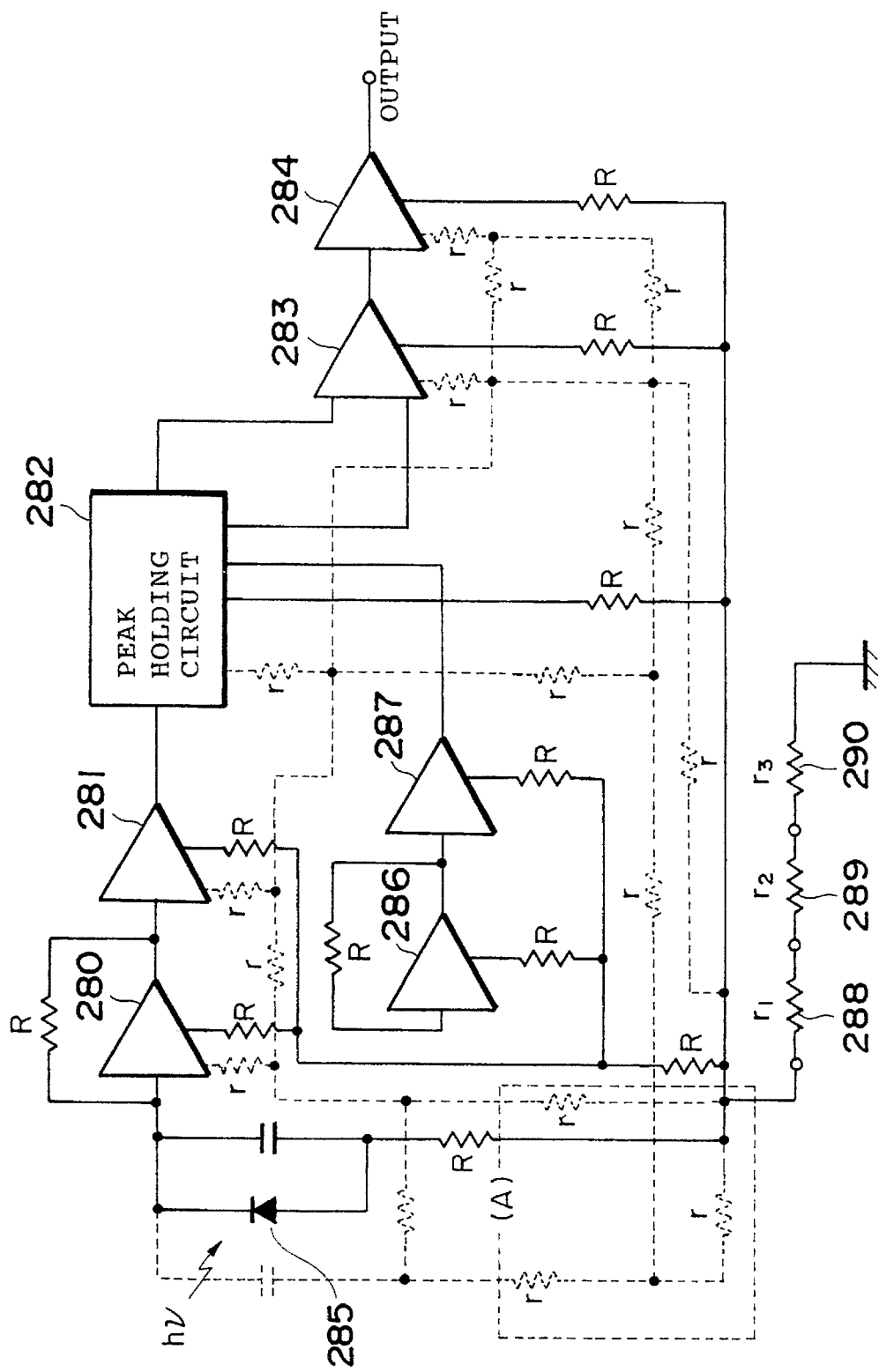
FIG. 10 is a circuit diagram showing one example of circuits of a PIN photodiode sensor shown in FIG. 9, including equivalent resistors of metallization or interconnection impedance.

Next, based on such principles, referring to FIG. 9 and FIG. 10, one example of the present invention as applied to the optical link circuit will be explained. FIG. 10 is a circuit diagram showing a photodiode sensor using a photodiode, and FIG. 9 is an example of the formation of the (integrated) PIN photodiode sensor shown in FIG. 10 on the same substrate. Functioning circuits 280–284, 286, 287 for processing a photoelectric current from a PIN photodiode 285 are formed in well regions 330a–330f by isolating from each other, and each functioning circuit 280–284, 286, 287 comprises an OP amplifier as shown in FIG. 9 and FIG. 10.

This circuit, first, applies the photoelectric current detected by the PIN photodiode 285 to a first current-voltage converting amplifier (a first TZ amplifier) 280 with the negative feedback to convert the photoelectric current into the voltage. Next, the output of the first TZ amplifier 280 is applied to a first amplifier 281 and amplified. Note that a second current-voltage converting amplifier (a second TZ amplifier) 286 with the negative feedback is a dummy amplifier of the first TZ amplifier 280, is connected to cathode of photodiode 285, and compensates undesirable variation of the output signal from the first TZ amplifier 280.

Next, the peak holding circuit 282 holds the peaks of the output signals from the first amplifier 281 and the second amplifier 287 connected to the output of the second TZ amplifier 286. Thereafter, the comparator 283 compares these signals at the fixed signal level, and the amplifier 284 amplifies the output of the comparator 283 and outputs the signal for optical communication. Note that a wire 288, a frame 289, and a lead wire 290 are consecutively connected to the input of the first TZ amplifier 280.

The functioning circuits, the first TZ amplifier 280, the first amplifier 281, a peak holding 282, a second TZ amplifier 286, the comparator 283, the amplifier 284 and the second amplifier 287) and the PIN photodiode 285 are formed on an N-type semiconductor substrate 300 which is a staring substrate (anode). Each functioning circuit is formed and isolated from each other in a plurality of P-type well layers 330, 330a–330f over an N⁻ layer 310 formed on the N-type semiconductor substrate 300.

As described above, the functioning circuits 280–284, 286, 287 are formed in the different P-type well layers 330a–330f and isolated from each other, so that the distributed resistance r (a resistance shown by a dotted line in FIG. 10), which is present between each of functioning circuits when all functioning circuits are formed in the same P-type well layer 330, can be eliminated. Further, the P-type well layers 330a–330f are divided to reduce the influence of the impedance shown as (A) in FIG. 10, whereas in the case that the P-type well layers 330a–330f are not divided, the influence of the impedance is infinite in DC because the starting substrate cannot be grounded. Accordingly, the modulation and the interference between each of the functioning circuits 280–284, 286, 287 can be prevented. Note that R in FIG. 10 denotes a resistor.

As described above, the functioning circuits 280–284, 286, 287 are formed in the respective isolated P-type well regions 330a–330f which are formed in the N⁻ high resistant epitaxial layer 310, so that in the same manner, malfunction of the (integrated) PIN photodiode sensor can be prevented. Note that in FIG. 9, both the first current-voltage converting amplifier 280 and the first amplifier 281, and both the second current-voltage converting amplifier 286 and the second amplifier 287 are formed in the well layers 330e and 330d, respectively, but of course, these amplifiers can be formed to be isolated from each other. Note that in the present embodiment, the circuit shown in FIG. 3 is formed on the same substrate as one example but other functioning circuits can be formed as long as they are for sensing or amplifying a current from a PIN photodiode.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 5-231,561 filed on Sep. 17, 1993 is hereby incorporated by reference.

What is claimed is:

1. An optical semiconductor device comprising a PIN photodiode, said optical semiconductor device comprising:
   a substrate of N-type semiconductor material;
   a low concentration N-type layer of semiconductor material formed on said substrate;
   a P-type semiconductor layer formed on said low concentration N-type layer, wherein said PIN photodiode has said substrate, said low concentration N-type layer and said P-type semiconductor layer;
   a first well layer of P-type semiconductor material formed on said low concentration N-type layer;
   a first functioning circuit formed on said first well layer;
   a second well layer of P-type semiconductor material formed on said low concentration N-type layer; and
   a second functioning circuit formed on said second well layer, whereby said first functioning circuit and said second functioning circuit are isolated from each other.

2. An optical semiconductor device according to claim 1, said optical semiconductor device further comprising a buffer layer of semiconductor material arranged between said substrate and said low concentration N-type layer.

3. An optical semiconductor device according to claim 2, wherein said buffer layer is an N-type epitaxial layer having a carrier concentration lower than that of said substrate.

4. An optical semiconductor device according to claim 1, further comprising:
   a first electrode formed on said first well layer; and
   a second electrode formed on said second well layer.

5. An optical semiconductor device according to claim 1, further comprising:
   a first electrode formed on said first well layer and being grounded; and
   a second electrode formed on said second well layer and being grounded.

6. An optical semiconductor device according to claim 1, further comprising:
   a first electrode electrically connected to said first well layer; and
   a second electrode electrically connected to said second well layer.

7. An optical semiconductor device according to claim 1, said optical semiconductor device comprising:
   a first electrode electrically connected to said first well layer and being grounded; and a second electrode electrically connected to said second well layer and being grounded.

8. An optical semiconductor device according to claim 1, wherein said first functioning circuit has a first transistor, and said second functioning circuit has a second transistor.

9. An optical semiconductor device according to claim 1, wherein said first functioning circuit has a first OP amplifier, and said second functioning circuit has a second OP amplifier.

10. An optical semiconductor device according to claim 1, wherein said PIN photodiode and said first functioning circuit are electrically connected, and said first functioning circuit processes a signal from said PIN photodiode.

11. An optical semiconductor device according to claim 10, wherein said first functioning circuit and second functioning circuit are electrically connected, and said second functioning circuit processes a signal from said first functioning circuit.

12. An optical semiconductor device according to claim 11, wherein said first functioning circuit is a first OP amplifier amplifying a signal from said PIN photodiode, and said second functioning circuit is a second OP amplifier amplifying a signal from said first functioning circuit.

13. An optical semiconductor device according to claim 11, wherein said first functioning circuit is a current-voltage converting amplifier and said second functioning circuit is a amplifier.

14. An optical semiconductor device according to claim 11, wherein said first functioning circuit is a current-voltage converting amplifier for converting a current signal from said PIN photodiode to voltage, and said second functioning circuit has an OP amplifier amplifying a voltage signal from said first functioning circuit.

15. An optical semiconductor device according to claim 11, said optical semiconductor device comprising a first OP amplifier, a second OP amplifier, a third OP amplifier and a forth OP amplifier, wherein said first functioning circuit has a current-voltage converting amplifier having said first OP amplifier electrically connected to a cathode of said PIN photodiode, said current-voltage converting amplifier converts a current signal from said PIN photodiode to voltage, said third OP amplifier is electrically connected to said anode of said PIN photo diode and connected to said first OP amplifier for compensating an undesirable variation of a signal from said first OP amplifier, said forth OP amplifier is a comparator comparing a output signal from said first OP amplifier with a fixed signal level, and said second functioning circuit has said second OP amplifier amplifying a signal from said forth OP amplifier.

16. An optical semiconductor device comprising a PIN photodiode, said optical semiconductor device comprising:

an N-type semiconductor substrate having a first concentration;

an N-type semiconductor layer having a second concentration, said N-type semiconductor layer being formed on said N-type semiconductor substrate to be an anode, wherein said second concentration is lower than said first concentration;

a P-type semiconductor layer having a third concentration to be a cathode, said P-type semiconductor layer being formed on a part of said N-type semiconductor layer, wherein said second concentration is lower than said third concentration; and a plurality of functioning circuits for processing a photoelectric current generated by irradiating said PIN photodiode with light, said functioning circuits being formed on a plurality of P-type wells formed on a remaining part of said N-type semiconductor layer, said functioning circuits being formed to be isolated from each other.

17. An optical semiconductor device according to claim 16, said optical semiconductor device further comprising a buffer layer of semiconductor material arranged between said N-type semiconductor substrate and said N-type semiconductor layer.

18. An optical semiconductor device according to claim 17, wherein said buffer layer is an N-type epitaxial layer having a carrier concentration lower than that of said substrate.

19. An optical semiconductor device according to claim 16, wherein said functioning circuit has a device having a PN junction.

20. An optical semiconductor device according to claim 16, wherein said functioning circuit has an OP amplifier.

21. An optical semiconductor device according to claim 16, wherein said PIN photodiode and said functioning circuits are electrically connected, and said functioning circuits processes a signal from said PIN photodiode.

22. An optical semiconductor device comprising:

a PIN photodiode having an N-type semiconductor substrate, a photon absorbing semiconductor layer formed on said N-type semiconductor substrate, and a semiconductor layer;

a first functioning circuit formed on a first P-type well layer formed on said N-type semiconductor layer; and a second functioning circuit formed on a second P-type well layer, wherein said first and second functioning circuits process a photoelectric current generated by irradiating said PIN photodiode with light; and an insulator arranged between said first P-type well layer and said P-type semiconductor layer.

23. An optical semiconductor device according to claim 22, wherein said first functioning circuit has a first NPN transistor including:

a first N-type collector layer formed on said first P-type well layer;

a first P-type base layer formed on said first N-type collector layer; and a first N-type emitter layer formed on said first P-type base layer.

24. An optical semiconductor device according to claim 23, wherein said second functioning circuit has a second NPN transistor including:

a second N-type collector layer formed on said second P-type well layer;

a second P-type base layer formed on said second N-type collector layer; and a second N-type emitter layer formed on said second P-type base layer.

* * * * *